(12) United States Patent
He et al.

(10) Patent No.: US 9,401,468 B2
(45) Date of Patent: Jul. 26, 2016

(54) LAMP WITH LED CHIPS COOLED BY A PHASE TRANSFORMATION LOOP

(71) Applicant: GE LIGHTING SOLUTIONS, LLC, East Cleveland, OH (US)

(72) Inventors: Jianmin He, Orange, OH (US); Jon Bennett Jansma, Pepper Pike, OH (US); Glenn Howard Kuenzler, Beachwood, OH (US)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 14/583,039

(22) Filed: Dec. 24, 2014

(65) Prior Publication Data

US 2016/0186978 A1    Jun. 30, 2016

(51) Int. Cl.
| | |
|---|---|
| H01J 1/02 | (2006.01) |
| H01J 7/24 | (2006.01) |
| H01J 61/52 | (2006.01) |
| H01K 1/58 | (2006.01) |
| H01L 33/64 | (2010.01) |

(Continued)

(52) U.S. Cl.
CPC ............. *H01L 33/648* (2013.01); *F21K 9/135* (2013.01); *F21K 9/50* (2013.01); *F21V 3/049* (2013.01); *F21V 29/503* (2015.01); *F21V 29/58* (2015.01); *F21Y 2101/02* (2013.01)

(58) Field of Classification Search
CPC ......... H01L 23/34; H01L 23/36; H01L 21/00; H01L 33/64; H01L 33/648; H01L 23/3731; H01L 23/3733; H01L 23/3735; F21V 29/00; F21V 29/002; F21V 29/56; F21V 29/58; F21V 29/503; F21V 3/049; F21V 29/004; H01J 7/24; H01J 7/28; H01J 61/52; F21K 9/135; F21K 9/50; F21K 9/00; F21Y 2101/02; H05K 7/20963
USPC ...................................... 313/46–47
See application file for complete search history.

(56) References Cited

U.S. PATENT DOCUMENTS 5,355,054 A * 10/1994 Van Lierop ........... H01J 65/048
313/11
5,589,823 A   12/1996 Lange (Continued)

FOREIGN PATENT DOCUMENTS

| DE | 102012015652 A1 | 2/2014 |
|---|---|---|
| DE | 102013017141 A1 | 3/2014 |

(Continued)

OTHER PUBLICATIONS

Gordon "Ballast Tubes as automatic voltage regulators", Electronics, vol. No. 15, pp. 26, on Jan. 1942.

(Continued)

*Primary Examiner* — Anne Hines
*Assistant Examiner* — Jose M Diaz
(74) *Attorney, Agent, or Firm* — GE Global Patent Operation; Peter T. DiMauro

(57) ABSTRACT

An apparatus includes an LED light source positioned within an envelope, a porous fluid transporting material coating the envelope, providing a path between the LED light source and the envelope, and a cooling medium conducted through the fluid transporting material toward the LED light source in a liquid phase and conducted from the LED light source to the envelope in a vapor phase for removing heat from the LED light source.

18 Claims, 2 Drawing Sheets

(51) Int. Cl.
*F21V 29/58* (2015.01)
*F21K 99/00* (2016.01)
*F21V 29/503* (2015.01)
*F21V 3/04* (2006.01)
*F21Y 101/02* (2006.01)

(56) References Cited

U.S. PATENT DOCUMENTS

| | | | |
|---|---|---|---|
| 6,349,760 B1 * | 2/2002 | Budelman | H01L 23/427 |
| | | | 165/104.33 |
| 6,791,259 B1 | 9/2004 | Stokes et al. | |
| 7,111,963 B2 | 9/2006 | Zhang | |
| 7,265,486 B2 | 9/2007 | Yoko et al. | |
| 7,295,435 B2 | 11/2007 | Ouyang | |
| 7,360,935 B2 | 4/2008 | Jensen et al. | |
| 7,789,534 B2 | 9/2010 | Wang | |
| 7,922,365 B2 | 4/2011 | Liu | |
| 7,946,737 B2 | 5/2011 | Liu | |
| 7,959,327 B2 | 6/2011 | Lai et al. | |
| 8,007,143 B2 | 8/2011 | Liu | |
| 8,021,023 B2 | 9/2011 | Liu | |
| 8,033,689 B2 | 10/2011 | Scott | |
| 8,070,318 B2 | 12/2011 | Chen | |
| 8,152,341 B2 | 4/2012 | Wheelock et al. | |
| 8,188,595 B2 | 5/2012 | Shuja | |
| 8,217,557 B2 | 7/2012 | Sills et al. | |
| 8,235,562 B2 | 8/2012 | Chen | |
| 8,247,956 B2 | 8/2012 | Liu | |
| 8,262,263 B2 | 9/2012 | Dinh | |
| 8,277,094 B2 | 10/2012 | Wheelock et al. | |
| 8,282,230 B2 | 10/2012 | Stewart et al. | |
| 8,283,190 B2 | 10/2012 | Allen et al. | |
| 8,348,470 B2 | 1/2013 | Liu et al. | |
| 8,378,559 B2 | 2/2013 | Shuja et al. | |
| 8,408,746 B1 | 4/2013 | Lauer | |
| 8,430,531 B2 | 4/2013 | Catalano | |
| 8,434,883 B2 | 5/2013 | Doan et al. | |
| 8,454,185 B2 | 6/2013 | Hua et al. | |
| 8,480,257 B2 | 7/2013 | Shang et al. | |
| 8,540,401 B2 | 9/2013 | Simon et al. | |
| 8,562,185 B2 | 10/2013 | Wheelock et al. | |
| 8,573,812 B2 | 11/2013 | Joung et al. | |
| 8,602,590 B2 | 12/2013 | Ghiu et al. | |
| 8,638,033 B2 | 1/2014 | Lenk et al. | |
| 8,653,723 B2 | 2/2014 | Cao et al. | |
| 2003/0062857 A1 | 4/2003 | Kling | |
| 2006/0090881 A1 | 5/2006 | Tuma | |
| 2008/0136330 A1 | 6/2008 | Wursching et al. | |
| 2009/0015131 A1 | 1/2009 | Wursching et al. | |
| 2009/0052187 A1 | 2/2009 | Li | |
| 2009/0101933 A1 | 4/2009 | Takao et al. | |
| 2009/0109671 A1 | 4/2009 | Yu et al. | |
| 2009/0212698 A1 | 8/2009 | Bailey | |
| 2010/0078151 A1 | 4/2010 | Koenigsberg et al. | |
| 2010/0079988 A1 | 4/2010 | Johnston et al. | |
| 2010/0271836 A1 | 10/2010 | Bakk | |
| 2011/0006830 A1 | 1/2011 | Kim et al. | |
| 2011/0044043 A1 | 2/2011 | Wong | |
| 2011/0073159 A1 | 3/2011 | Shen et al. | |
| 2011/0133222 A1 | 6/2011 | Allen et al. | |
| 2011/0193462 A1 | 8/2011 | Chang et al. | |
| 2011/0193479 A1 * | 8/2011 | Nilssen | F21K 9/135 |
| | | | 315/35 |
| 2011/0261563 A1 | 10/2011 | Li | |
| 2011/0267821 A1 | 11/2011 | Van De Ven et al. | |
| 2011/0299279 A1 | 12/2011 | Igl et al. | |
| 2012/0002401 A1 | 1/2012 | Clifford | |
| 2012/0068627 A1 | 3/2012 | Brooks | |
| 2012/0107622 A1 | 5/2012 | Borrelli et al. | |
| 2012/0188771 A1 * | 7/2012 | Kraus | F21V 3/02 |
| | | | 362/294 |
| 2012/0206927 A1 * | 8/2012 | Miyahara | F21V 29/004 |
| | | | 362/382 |
| 2012/0230012 A1 | 9/2012 | Bohler et al. | |
| 2012/0306340 A1 | 12/2012 | Hoetzl et al. | |
| 2012/0314415 A1 | 12/2012 | Lee | |
| 2013/0001444 A1 | 1/2013 | Zhou et al. | |
| 2013/0010464 A1 | 1/2013 | Shuja et al. | |
| 2013/0037844 A1 | 2/2013 | Hatano et al. | |
| 2013/0049041 A1 | 2/2013 | Ramer et al. | |
| 2013/0058080 A1 | 3/2013 | Ge et al. | |
| 2013/0058100 A1 | 3/2013 | Derose | |
| 2013/0063933 A1 | 3/2013 | Roy | |
| 2013/0083533 A1 | 4/2013 | Janik et al. | |
| 2013/0094178 A1 | 4/2013 | Huang et al. | |
| 2013/0113358 A1 | 5/2013 | Progl et al. | |
| 2013/0133864 A1 | 5/2013 | Yang et al. | |
| 2013/0155695 A1 | 6/2013 | Liu | |
| 2013/0162139 A1 | 6/2013 | Liu | |
| 2013/0169147 A1 | 7/2013 | Ooya et al. | |
| 2013/0189803 A1 | 7/2013 | Nasaani et al. | |
| 2013/0194796 A1 | 8/2013 | Progl | |
| 2013/0256598 A1 | 10/2013 | Borrelli et al. | |
| 2013/0271972 A1 | 10/2013 | Hussell et al. | |
| 2013/0271987 A1 | 10/2013 | Hussell et al. | |
| 2013/0271989 A1 | 10/2013 | Hussell et al. | |
| 2013/0301252 A1 | 11/2013 | Hussell et al. | |
| 2014/0015397 A1 | 1/2014 | Chen | |
| 2014/0160763 A1 | 6/2014 | Dudik et al. | |
| 2014/0233233 A1 * | 8/2014 | Park | F21V 29/004 |
| | | | 362/249.02 |

FOREIGN PATENT DOCUMENTS

| | | |
|---|---|---|
| EP | 2571066 A1 | 6/1999 |
| EP | 1471564 A2 | 10/2004 |
| EP | 922305 B1 | 8/2007 |
| JP | 2000091690 | 3/2000 |
| WO | 9854929 A2 | 12/1998 |
| WO | 2008093978 A1 | 8/2008 |
| WO | 2010061087 A1 | 6/2010 |
| WO | 2011095616 A2 | 8/2011 |
| WO | 2012031533 A1 | 3/2012 |
| WO | 2012148355 A1 | 11/2012 |
| WO | 2013027148 A1 | 2/2013 |
| WO | 2013060357 A1 | 5/2013 |
| WO | 2013067945 A1 | 5/2013 |
| WO | 2013082803 A1 | 6/2013 |
| WO | 2013097755 A1 | 7/2013 |
| WO | 2013118946 A1 | 8/2013 |
| WO | 2013137493 A1 | 9/2013 |
| WO | 2013137517 A1 | 9/2013 |
| WO | 2013144777 A1 | 10/2013 |
| WO | 2013144919 A1 | 10/2013 |
| WO | 2013178595 A1 | 12/2013 |
| WO | 2014001483 A1 | 1/2014 |

OTHER PUBLICATIONS

Rawlings "Current and Voltage Regulators", Radio Handbook, Chapter 33, I.E.E., Associate Brit. I.R.E., vol. No. 4, pp. 1213-1222, on 1952.
"Iron-Hydrogen Resistor", https://en.wikipedia.org/wiki/Ironhydrogen_resistor, 2 Pages, Retrieved on Apr. 20, 2016.

\* cited by examiner

LAMP WITH LED CHIPS COOLED BY A PHASE TRANSFORMATION LOOP

FIELD

The disclosed exemplary embodiments relate generally to lighting systems, and more particularly to light emitting diode (LED) lighting systems.

BACKGROUND

Incandescent light bulbs create light by conducting electricity through a resistive filament, heating the filament to a very high temperature to produce visible light. Incandescent bulbs are made in a wide range of sizes and voltages. The bulbs typically include an enclosure with a tungsten filament inside and a base connector that provides both an electrical and structural support connection. Incandescent bulbs generally mate with a lamp socket having a threaded Edison base connector, bayonet base connector, pin base connector, or any suitable connector for providing electrical power to the bulb. However, incandescent light bulbs are generally inefficient and require frequent replacement. These lamps are in the process of being replaced by more efficient types of electric light such as fluorescent lamps, high-intensity discharge lamps, and, in particular, LED light sources.

LED technology continues to advance resulting in improved efficiencies and lower costs with LED light sources found in lighting applications ranging from small pin point sources to stadium lights. An LED light may be 60-70% more efficient than an incandescent light but may still generate significant amounts of heat. At higher temperatures, light conversion efficiency for an LED light source may drop as power increases, LED life decreases, and light output may be permanently diminished.

While an incandescent light may generate a substantial amount of heat, the heat is generally radiated from the typically free standing filament through the light envelope into the surrounding air. In contrast, an LED light source is generally chip mounted and heat is conducted away through a heat sink. Existing light fixtures are largely adapted to dissipate radiated heat and usually have very little capacity to dissipate conducted heat. In order to reach desired lumen values and maintain compatibility with a significantly large installed base of presently existing fixtures, additional cooling techniques may be required.

Nilssen et al. (US 2011/0193479) discloses an LED lamp that removes heat using evaporation of water or other coolant inside a glass lamp structure. When cold, the coolant pools at the lowest part of the enclosure and a structure may be provided to conduct heat from the LEDs to the coolant or to wick the coolant from the pool to the immediate vicinity of the LEDs. A position switch is provided to ensure that the bulb may only be operated in positions where the structure or wick are in contact with the coolant pool.

Tuma (US 2006/0090881) discloses a device for immersing an electronic component in a cooling fluid. The cooling fluid is disposed within an enclosed volume such that the device is installed over a heat dissipating component and a breachable seal of the enclosed volume is breached, allowing the cooling fluid to contact the heat dissipating component and transfer heat to a sidewall of the device.

Lenk et al. (U.S. Pat. No. 8,638,033) discloses an LED covered with a shell which may or may not contain phosphor for converting the light spectrum emitted by the LED. The shell covered LED is positioned within an outer bulb shell which may also enclose one or more phosphors in a filler material. The filler material may be a thermally conductive fluid, plastic, gel, hydrogel, water, or other material.

Wheelock et al. (U.S. Pat. No. 8,152,341, U.S. Pat. No. 8,277,094, and U.S. Pat. No. 8,562,185) discloses an LED bulb containing a thermally conductive liquid within a shell. A liquid volume compensator is included to compensate for expansion of the thermally conductive liquid. A first volume for the thermally conductive liquid is provided when the compensator is in a first position, and a second volume for the thermally conductive fluid is provided when the compensator is in a second position. It would be advantageous to provide structures and techniques to dissipate heat generated by LED sources that overcome the disadvantages of the prior art solutions.

SUMMARY

The disclosed embodiments are directed to cooling an LED light source by providing a cooling medium to the LED light source that undergoes a phase change from liquid to vapor and effectively conveys heat away from the LED light source to a surrounding envelope.

In at least one exemplary embodiment, an apparatus includes an LED light source positioned within an envelope, a porous fluid-transporting material coating on at least a portion of the envelope providing a path between the LED light source and the envelope, and a cooling medium conducted through the porous fluid transporting material for removing heat from the LED light source.

In one or more exemplary embodiments, a method of cooling an LED light source includes positioning the LED light source within an envelope, providing a fluid conducting material between the LED light source and the envelope, and conducting a cooling medium through the fluid conducting material toward the LED light source in a liquid phase and conducting the cooling medium from the LED light source to the envelope in a vapor phase to remove heat from the LED light source.

BRIEF DESCRIPTION OF THE DRAWINGS

The foregoing and other aspects of the disclosed embodiments are made more evident in the following Detailed Description, when read in conjunction with the attached Drawing Figures, wherein.

DETAILED DESCRIPTION

The embodiments disclosed herein utilize capillary action and phase transformation for conveying heat away from an LED light source, for example, an LED chip. In one or more aspects, the present embodiments utilize a cooling medium that flows to the LED light source through capillary action, undergoes a phase transformation, and conveys heat away from the LED light source to a surrounding environment.

Figure 1:
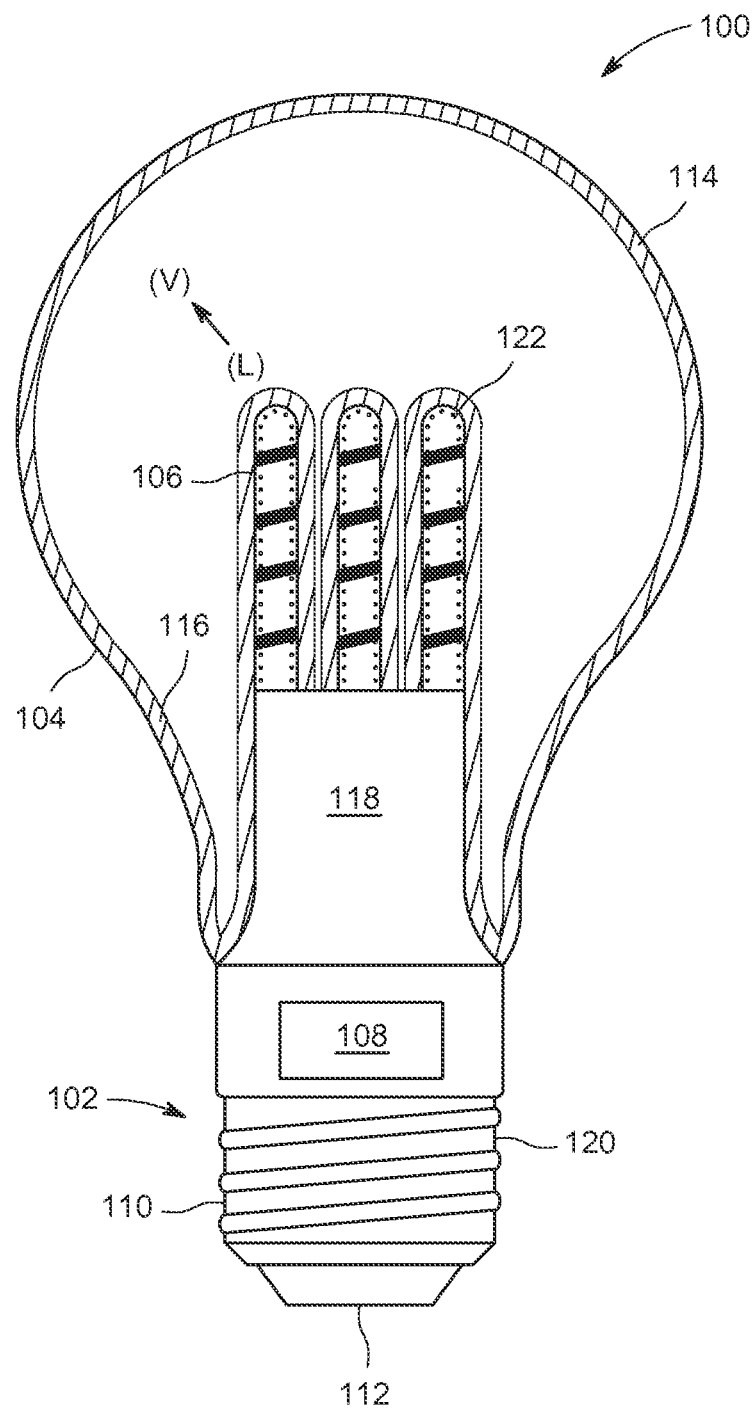
FIG. 1 shows a schematic diagram of an LED based light bulb according to the disclosed embodiments.

FIG. 1 is a schematic diagram of an exemplary LED light bulb 100 incorporating the structures and techniques disclosed herein. The light bulb 100 includes a base 102, an envelope 104, an LED light source 106, typically mounted on an extension of the base 102, and a power supply 108, typically housed within the base 102.

The extension of the base 102 may be implemented as a light source support 118, and the base may further include a base connector 120. The base connector 120 may include electrical contacts, for example contacts 110, 112, for supplying electrical power to power supply 108. In at least one embodiment, contact 110 may be a threaded contact and contact 112 may be a button contact forming a standard Edison base connector. Contacts 110, 112 may connect power supply 108 to a standard 120V or 230V A.C. mains supply or any other suitable external power source. While an E26 base connector is illustrated, it should be understood that the disclosed embodiments may include any E style connector, for example, E11, E12, E17, any bayonet, screw, single or double contact, or mogul connector, or any base connector suitable for use with the disclosed embodiments.

Power supply 108 may include circuitry for conditioning the power provided by contacts 110, 112 for use by the LED light source 106. In one or more aspects, the power supply 108 may include power conditioning, power conversion, power regulation, power factor correction, polarity correction, or other circuitry as required to adapt power from the external power source to drive the LED light source 106. In at least one embodiment, power supply 108 may include a rectifier for rectifying an input of 120V or 230V A.C., a DC-DC converter, and filtering components for providing a constant current to the LED light source 106.

Envelope 104 may generally enclose the LED light source 106 and may be constructed of glass, plastic, translucent ceramic, or other suitable material for transmitting light and for confining the cooling medium within the envelope 104. While an "A" type envelope is shown, it should be understood that the disclosed embodiments may include AR, B, BR, C, E, ER, G, K, MB, MR, PAR, R, S, T, or any suitable envelope shape. For example, A refers to a classic Edison envelope, B refers to a candle shaped envelope, G refers to a globe shaped envelope, R refers to a reflector envelope, and T refers to a tube shaped envelope. However, the disclosed embodiments may utilize any appropriate envelope profile. At least one surface of envelope 104 may inherently diffuse light or may include frosting, texturing, a light diffusing coating, embedded light scattering particles, or other material for diffusing light. In at least one aspect, the envelope may be hermetically sealed and confines a cooling medium 116, for example, an evaporating fluid.

In at least one embodiment, an interior surface of the envelope, or portion thereof, may be covered with a base coat of a fluid transporting material 114 for absorbing and conveying the cooling medium 116 mentioned above. The fluid transporting material 114 may comprise nano-sized oxide particles, for example, nano-alumina, and may be porous, for example, having pores ranging from nanometer to micrometer size. The fluid transporting material 114 may absorb the cooling medium and provide a conduit for the cooling medium between the LED light source and the envelope regardless of the orientation of the LED light bulb 100. As the temperature of the LED light source increases, capillary action conducts the cooling medium from the relatively cooler envelope to the LED light source regardless whether the LED light bulb has a vertical, horizontal or any other orientation. In at least one embodiment, the fluid transporting material 114 may be fabricated to diffuse light to reduce glare and to provide a more consistent illumination. According to one or more embodiments, the fluid transporting material 114 may have a refractive index approximating that of the cooling medium 116, reducing light scattering occurring at the interface between the fluid transporting material 114 and the cooling medium 116, advantageously reducing the visibility of the fluid transporting material 114, providing improved reflector performance, and a better cosmetic appearance. An exemplary fluid transporting material 114 may include a porous material of particles that are optically transparent or translucent and provide consistent and stable light distribution. The fluid transporting material 114 may comprise metal oxide, for example, $Al_2O_3$ particles. The fluid transporting material 114 may also comprise organic material, for example, a polymer based coating. In one or more embodiments, the fluid transporting material 114 may be made of any material or combination of materials suitable for distributing the cooling medium 116 under the conditions within the envelope.

The LED light source 106 may include one or more LEDs generally mounted on a substrate on light source support 118 within envelope 104. The LEDs may include a multi-color white arrangement of a combination of red, green, and blue LEDs, near UV or UV LEDs in combination with an RGB phosphor, blue LEDs in combination with a yellow phosphor, white LEDs, or any suitable arrangement of LEDs and, if required, any suitable material 122 for converting the LED output to broad spectrum white light. In at least one aspect of the disclosed embodiments, the LEDs of the LED light source 106 may be coated with the material 122 for converting the LED output to broad spectrum white light. According to the disclosed embodiments, the LED light source 106 and the light source support 118 may also be coated with the fluid transporting material 114, forming a continuous path or layer over the LED light source 106, the light source support 118, and the envelope 104. It should be understood that while the material 122 for converting the LED output is shown as an inner layer with respect to the LEDs and the fluid transporting material 114, the layers may be interchanged such that the fluid transporting material 114 may be an inner layer.

As mentioned above, the embodiments disclosed herein utilize capillary action and phase transformation of the cooling medium 116 to convey heat away from the LED light source 106 to the surrounding environment. In at least one exemplary embodiment, the cooling medium 116 comprises water. In other embodiments, the cooling medium may comprise alcohol, or a mixture of water and alcohol. Exemplary alcohols may include ethanol, isopropyl, or methanol. In still other embodiments, ammonia may be used as a cooling medium. In further embodiments, the cooling medium may comprise one or more chlorofluorocarbons, hydrofluorocarbons. It should be understood that the cooling medium 116 may include any suitable material or combination of materials capable of capillary action flow, vaporization, and condensation within the envelope 104 at the operating temperature of the LED light source 106.

Still referring to FIG. 1, in at least one exemplary embodiment, the cooling medium 116 is introduced into the fluid transporting material 114 covering the interior surface of the envelope 104, the LED light source 106, and the light source support 118. The envelope 104 may be hermetically sealed to the base 102, enclosing the LED light source 106 and the light source support 118. As the temperature of the LED light source 106 increases, for example, when power is applied from power supply 108, the cooling medium 116 experiences a lower surface tension and flows through the fluid transporting material 114 to the higher temperature of the LED light source 106 through capillary action. At the LED light source 106, the cooling medium 116 undergoes an endothermic phase transformation from liquid (L) to vapor (V). The vapor condenses on the cooler surface of the envelope 104 and is reabsorbed by the fluid transporting material 114, thus effecting a liquid-vapor phase transformation loop inside the envelope 104. The liquid-vapor phase transformation loop operates to transfer heat from the LED light source 106 toward the envelope 104, effectively cooling the LED light source 106.

In some of the disclosed embodiments, air may be removed from the hermetically sealed envelope 104 such that the pressure inside the envelope 104 is less than atmospheric pressure, lowering the boiling point and promoting evaporation of the cooling medium 116. When power is applied to the LED light source 106, the temperature inside the envelope 104 increases according to the vapor pressure of the cooling medium 116, where the vapor pressure is dependent on the coldest spot within the envelope 104. As the LED light source 106 continues to operate, the pressure and temperature within the envelope 104 increases until reaching an equilibrium where the cooling medium 116 transforms from liquid to vapor in the vicinity of the LED light source 106, the vapor condenses on the surface of the envelope 104 and is reabsorbed by the fluid transporting material 114 and travels back to the LED light source 106.

Figure 2:
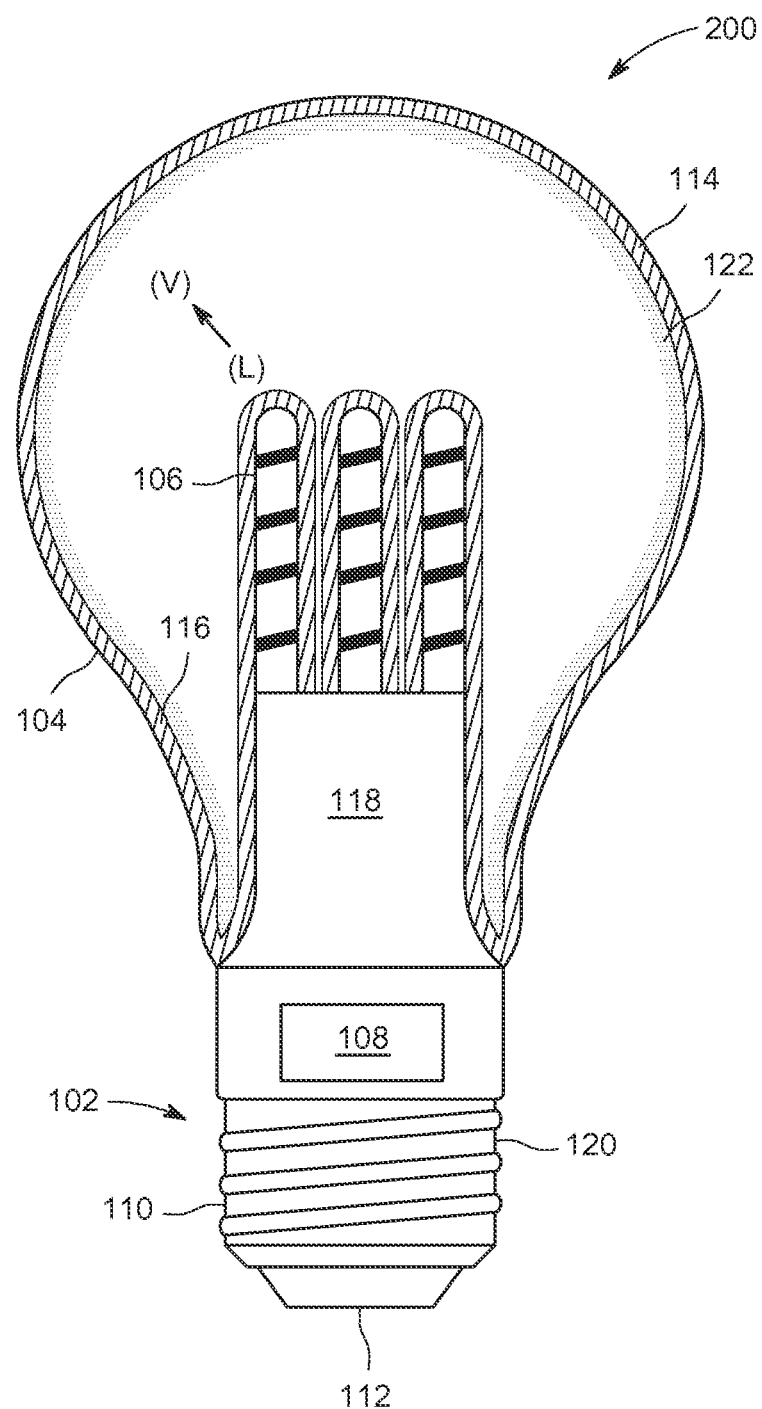
FIG. 2 illustrates another aspect of an LED based light bulb according to the disclosed embodiments.

FIG. 2 illustrates an exemplary LED light bulb 200, where the phosphor, or material for converting the LED output to broad spectrum white light 122, is implemented as a layer on the envelope 104, remote from the LED light source 106. While the material 122 for converting the LED output is shown as an inner layer with respect to the fluid transporting material 114 and the envelope 104, it should be understood that the layers may be interchanged such that the fluid transporting material 114 may be an inner layer with respect to the material for converting the LED output 122 and the envelope 104.

In this aspect, the cooling medium 116 is introduced into the fluid transporting material 114 covering the interior surface of the envelope 104, the LED light source 106, and the light source support 118. The envelope 104 may be hermetically sealed to the base 102, enclosing the LED light source 106 and the light source support 118. Again, as the temperature of the LED light source 106 increases, the cooling medium 116 experiences a lower surface tension and flows through the fluid transporting material 114 to the higher temperature of the LED light source 106 through capillary action. At the LED light source 106, the cooling medium 116 undergoes an endothermic phase transformation from liquid (L) to vapor (V). The vapor condenses on the cooler surface of the envelope 104 and is reabsorbed by the fluid transporting material 114, thus effecting a liquid-vapor phase transformation loop inside the envelope 104. The liquid-vapor phase transformation loop operates to transfer heat from the LED light source 106 toward the envelope 104, effectively cooling the LED light source 106.

The disclosed embodiments provide structures and techniques for effectively cooling LED light sources by utilizing a fluid liquid-vapor phase transformation mechanism. When used by themselves or in combination with other cooling mechanisms, the disclosed embodiments may result in a lower LED junction temperature and higher lumen efficacy. In at least one aspect, the disclosed embodiments may reduce or eliminate the need for heat sinking for conducting heat away from the LED light source. Furthermore, implementation of the disclosed embodiments may result in lower material and manufacturing costs, in particular for an enterprise with pre-existing expertise related to coatings and envelope fabrication.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Furthermore, some of the features of the exemplary embodiments could be used to advantage without the corresponding use of other features. As such, the foregoing description should be considered as merely illustrative of the principles of the disclosed embodiments and not in limitation thereof.

What is claimed is:

1. An apparatus comprising:
    an LED light source positioned within an envelope;
    a porous fluid transporting material coating on at least a portion of the envelope providing a path between the LED light source and the envelope; and
    a cooling medium conducted through the porous fluid transporting material for removing heat from the LED light source.

2. The apparatus of claim 1, wherein, when the apparatus is in operation, the cooling medium is conducted through the porous fluid transporting material toward the LED light source in a liquid phase and is conducted from the LED light source to the envelope in a vapor phase.

3. The apparatus of claim 1, wherein the envelope has a shape confining the LED light source, the porous fluid transporting material, and the cooling medium.

4. The apparatus of claim 1, wherein the porous fluid transporting material comprises oxide particles.

5. The apparatus of claim 1, wherein the porous fluid transporting material comprises $Al_2O_3$ particles.

6. The apparatus of claim 1, wherein the porous fluid transporting material comprises polymer particles.

7. The apparatus of claim 1, wherein the porous fluid transporting material provides a capillary path between the LED light source and the envelope.

8. The apparatus of claim 7, wherein the porous fluid transporting material coats the envelope to provide a capillary path between the LED light source and the envelope for any orientation of the apparatus.

9. The apparatus of claim 1 wherein the cooling medium comprises water.

10. The apparatus of claim 1 wherein the cooling medium comprises an alcohol.

11. The apparatus of claim 1 wherein the cooling medium comprises a combination of water and alcohol.

12. The apparatus of claim 1 wherein the cooling medium comprises a chlorofluorocarbon or a hydrofluorocarbon material.

13. The apparatus of claim 1 wherein the cooling medium comprises a material effecting a liquid-vapor phase transformation loop at an operating temperature of the LED light source.

14. The apparatus of claim 1 wherein the cooling medium is conducted from the LED light source to the envelope in a vapor phase.

15. The apparatus of claim 1 wherein the LED light source comprises one or more LEDS coated with a material for converting the LED output to white light.

16. The apparatus of claim 1 wherein the envelope is coated with a material for converting an output of the LED light source to white light.

17. The apparatus of claim 1 wherein the porous fluid transporting material has optical diffusing properties.

18. The apparatus of claim 1 wherein refractive index of the coating substantially matches the cooling medium in a fluid state.

\* \* \* \* \*